(12) United States Patent
Li et al.

(10) Patent No.: US 12,733,140 B2
(45) Date of Patent: Sep. 8, 2026

(54) TOP-MOUNTED HEAT DISSIPATION PHOTOVOLTAIC INVERTER DEVICE

(71) Applicant: Huawei Digital Power Technologies Co., Ltd., Shenzhen (CN)

(72) Inventors: Maofan Li, Dongguan (CN); Zhibing Yang, Shanghai (CN); Faming Sun, Dongguan (CN)

(73) Assignee: HUAWEI DIGITAL POWER TECHNOLOGIES CO., LTD., Shenzhen (CN)

( * ) Notice: Subject to any disclaimer, the term of this patent is extended or adjusted under 35 U.S.C. 154(b) by 295 days.

(21) Appl. No.: 18/660,539

(22) Filed: May 10, 2024

(65) Prior Publication Data

US 2024/0389282 A1 Nov. 21, 2024

(30) Foreign Application Priority Data

May 19, 2023 (CN) ......................... 202310570772.8

(51) Int. Cl.
*H05K 7/20* (2006.01)
*H10W 40/73* (2026.01)

(52) U.S. Cl.
CPC ..... *H05K 7/20936* (2013.01); *H05K 7/20909* (2013.01); *H10W 40/73* (2026.01)

(58) Field of Classification Search
CPC ........... H05K 7/20309; H05K 7/20318; H05K 7/20909; H05K 7/20936; H10W 40/73
See application file for complete search history.

(56) References Cited

U.S. PATENT DOCUMENTS

2008/0060371 A1* 3/2008 Jude ........................ F25D 29/00 62/259.2

FOREIGN PATENT DOCUMENTS

CN 100394128 C 6/2008
CN 202734073 U 2/2013
CN 203574550 U 4/2014
CN 207040129 U * 2/2018

(Continued)

OTHER PUBLICATIONS

WO-2022133694-A1 Translation (Year: 2022).*
CN-213126882-U Translation (Year: 2021).*
CN-207040129-U Translation (Year: 2018).*

*Primary Examiner* — Jayprakash N Gandhi
*Assistant Examiner* — Matthew Sinclair Muir
(74) *Attorney, Agent, or Firm* — Conley Rose, P.C.

(57) ABSTRACT

A top-mounted heat dissipation photovoltaic inverter device includes an inverter module and a top-mounted heat dissipation module. The top-mounted heat dissipation module includes a top-installed heat dissipation assembly and a back-mounted heat dissipation assembly. The top-installed heat dissipation assembly includes a condenser and a fan assembly. The back-mounted heat dissipation assembly includes an evaporator and an air-cooled heat sink. The condenser and the box are arranged in a laminated manner in a first direction. The condenser and the fan assembly are arranged adjacently in a second direction. The box, the evaporator, and the air-cooled heat sink are arranged sequentially and adjacently in the second direction. A projection of the top-installed heat dissipation assembly does not overlap with a projection of the back-mounted heat dissipation assembly in a third direction.

20 Claims, 4 Drawing Sheets

(56) References Cited

FOREIGN PATENT DOCUMENTS

| | | | | | |
|---|---|---|---|---|---|
| CN | 212034000 | U | | 11/2020 | |
| CN | 213126882 | U | * | 5/2021 | |
| CN | 114665689 | A | | 6/2022 | |
| CN | 216959650 | U | | 7/2022 | |
| CN | 115397185 | A | | 11/2022 | |
| CN | 115955825 | A | | 4/2023 | |
| WO | WO-2022133694 | A1 | * | 6/2022 | ............ H10W 40/22 |

* cited by examiner

TOP-MOUNTED HEAT DISSIPATION PHOTOVOLTAIC INVERTER DEVICE

CROSS-REFERENCE TO RELATED APPLICATION

This claims priority to Chinese Patent Application No. 202310570772.8 filed on May 19, 2023, which is hereby incorporated by reference in its entirety.

TECHNICAL FIELD

This application relates to the field of heat dissipation technologies, and in particular, to a top-mounted heat dissipation photovoltaic inverter device.

BACKGROUND

As power of an inverter is increasingly larger, power and density of a power transistor inside an inverter box increase gradually, and heat generated by the inverter is also increasingly larger. An excessively high temperature affects a service life and reliability of the power transistor, and further affects an overall service life of the inverter. Therefore, as the power and the density of the power transistor in the inverter increase, a requirement for a heat dissipation capability increases sharply. The inverter generally uses the following two heat dissipation manners. A first manner is to dissipate heat for the inverter through a combination of die-casting integrated heat sink and natural heat dissipation. The other is to dissipate heat for the inverter through a combination of a shovel-tooth heat sink and forced air cooling. Because the heat generated by the inverter gradually increases, a heat dissipation requirement of the inverter cannot be met currently by using the foregoing heat dissipation manners.

How to effectively dissipate the heat for the inverter to improve heat dissipation performance of the inverter has become an urgent technical problem that needs to be resolved currently.

SUMMARY

This application provides a top-mounted heat dissipation photovoltaic inverter device. The top-mounted heat dissipation photovoltaic inverter device can enable a heat generation inverter circuit in an inverter chassis to dissipate heat quickly, thereby improving reliability of the inverter device. In addition, the foregoing top-mounted heat dissipation photovoltaic inverter device has a compact structure and an internal structure that is properly set, and maintenance is convenient.

A top-mounted heat dissipation photovoltaic inverter device provided in this application includes an inverter module and a top-mounted heat dissipation module. The foregoing inverter module includes an inverter circuit and a box. The inverter circuit includes a power circuit board and a plurality of power transistors. The foregoing box is configured to accommodate the power circuit board. The power circuit board is configured to fasten the plurality of power transistors. The top-mounted heat dissipation module includes a top-installed heat dissipation assembly and a back-mounted heat dissipation assembly. The top-installed heat dissipation assembly includes a condenser and a fan assembly. The back-mounted heat dissipation assembly includes an evaporator and an air-cooled heat sink. The condenser and the box are arranged in a laminated manner in a first direction. The condenser and the fan assembly are arranged adjacently in a second direction. The box, the evaporator, and the air-cooled heat sink are arranged sequentially and adjacently in the second direction. A projection of the top-installed heat dissipation assembly does not overlap with a projection of the back-mounted heat dissipation assembly in a third direction. The first direction, the second direction, and the third direction are orthogonal to each other. The evaporator and the air-cooled heat sink are arranged adjacently, so that space occupied by the back-mounted heat dissipation assembly can be reduced, and a structure of the photovoltaic inverter device is compact.

When the foregoing inverter device works, the inverter circuit in the inverter module dissipates heat, so that a temperature of the inverter module is high. The top-mounted heat dissipation module is configured to dissipate heat for the inverter module. The top-mounted heat dissipation module and the inverter module separately perform modular assembly by using a pre-integrated mode, improving assembly efficiency. The evaporator and the condenser dissipate heat for the inverter circuit, and the air-cooled heat sink dissipates heat for the box. In the third direction, projections of the condenser, the fan assembly, the evaporator, and the air-cooled heat sink do not overlap, and the heat dissipation assemblies do not block each other, so that heat dissipation effect is good, and heat dissipation efficiency of the top-installed heat dissipation assembly and the back-mounted heat dissipation assembly is improved.

In an implementation, the top-mounted heat dissipation module includes a top housing and a rear housing. The top housing and the rear housing are fastened to the box. The top housing and the box are arranged in a laminated manner in the first direction. The rear housing and the box are arranged adjacently in the second direction. The top housing and the rear housing are arranged in a laminated manner in the first direction. The top housing and the rear housing are connected to form an L-shaped housing. The foregoing inverter circuit further includes a plurality of inductor modules. The plurality of inductor modules is arranged sequentially and adjacently in the third direction. The top housing is configured to fasten the condenser and the fan assembly. The rear housing is configured to fasten the evaporator, the air-cooled heat sink, and the plurality of inductor modules. The top housing and the rear housing are connected to the box in a detachable installation manner. During device maintenance, the heat dissipation assembly can be maintained in a targeted manner to improve maintenance efficiency. For example, when the condenser and the fan assembly are maintained, only the top housing is disassembled. When the evaporator, the air-cooled heat sink, and an inductor component are maintained, only the rear housing is disassembled. A projection of the top housing, a projection of the rear housing and a projection of the box do not overlap in the third direction, and the housings do not block each other, so that heat dissipation effect is good and maintenance is convenient. In addition, the foregoing inductor module also generates heat when working, and the inductor module is disposed outside the box, so that a quantity of heat generation devices in the box is reduced, and density of the heat generation devices in the box is low. This reduces a temperature in the box and further allows a size of the box to be small.

In an implementation, a gap between the foregoing top housing and the box forms a first cavity. The condenser and the fan assembly are arranged adjacently in the first cavity in the second direction. A gap between the rear housing and the box forms a second cavity. The second cavity is configured to accommodate the evaporator, the air-cooled heat sink, and the plurality of inductor modules. The evaporator and the air-cooled heat sink are arranged adjacently in the second cavity in the second direction. The foregoing condenser communicates with the evaporator through at least one pipe. The at least one pipe is arranged in the second cavity in the third direction. The foregoing first cavity and the second cavity are connected to form an L-shaped cavity, and the cavity is a heat dissipation channel of the top-installed heat dissipation assembly and the back-mounted heat dissipation assembly. The condenser, the fan assembly, the evaporator, the air-cooled heat sink, and the plurality of inductor modules are located in the foregoing L-shaped cavity. Air can flow in the L-shaped cavity, improving heat dissipation efficiency of the top-mounted heat dissipation module.

In an implementation, the foregoing box includes a box top plate and a box bottom plate. The box top plate and the box bottom plate are arranged opposite to each other in the first direction. The box top plate and the top housing are enclosed to form the first cavity. A length of the first cavity is greater than a length of the box top plate in the second direction, so that space of the first cavity is large to accommodate the condenser and the fan assembly.

In an implementation, the top-mounted heat dissipation module includes a plurality of brackets. The plurality of brackets is fastened to the condenser. The plurality of brackets is arranged between the condenser and the box top plate in the third direction. The box supports the condenser through the plurality of brackets, so that the condenser is installed securely, improving reliability of the condenser. In addition, the condenser is not in contact with the box, and heat of the box is not transferred to the condenser. The condenser is in a low-temperature state, so that condensation efficiency is improved.

In an implementation, the box includes a box cover plate and a box rear plate. The box cover plate and the box rear plate are arranged opposite to each other in the second direction. A location of the box cover plate is considered as a front side of the inverter device, and a location of the box rear plate is considered as a rear side of the inverter device. The box cover plate can be opened to facilitate maintenance of the inverter circuit inside the inverter module. The box rear plate and the rear housing are enclosed to form the second cavity. A length of the second cavity is less than or equal to a length of the box rear plate in the first direction, so that the second cavity is consistent with the box, which is beautiful.

In an implementation, the box rear plate includes two heat exchanger communication holes. The heat exchanger communication holes penetrate through the box rear plate in the second direction. The two heat exchanger communication holes are configured to communicate with an inlet and an outlet of the air-cooled heat sink respectively. The air-cooled heat sink is configured to dissipate heat for hot air in the box. The air-cooled heat sink assists the evaporator and the condenser to dissipate heat for the inverter module, improving heat dissipation efficiency of the top-mounted heat dissipation module for the inverter module.

In an implementation, the box rear plate includes a heat dissipation window. The heat dissipation window penetrates through the box rear plate in the second direction. The power circuit board is fastened to a side that is of the box rear plate and that faces away from the rear housing. The power transistor is fastened to a side that is of the power circuit board and that faces the rear housing and is in contact with the evaporator through the heat dissipation window. A projection of the power circuit board and a projection of the evaporator cover a projection of the heat dissipation window in the second direction. The evaporator directly contacts the power transistor to dissipate heat for the power transistor. The evaporator is connected to the condenser through the pipe. Liquid refrigerant in the evaporator is vaporized by heat and enters the condenser through the pipe. Then, a vaporized refrigerant is condensed into a liquid state through the condenser and flows back to the evaporator through the pipe.

In an implementation, the box rear plate includes at least one inductor communication hole. The inductor communication hole penetrates through the box rear plate in the second direction. The inductor communication hole is configured to communicate the power transistor with the inductor module.

In an implementation, the top housing includes two top side plates and a slide rail. The two top side plates are arranged opposite to each other in the third direction. The slide rail is fastened between the two top side plates. The slide rail is configured to slidably install the fan assembly in the third direction. At least one of the top side plates includes a fan mounting hole. A projection of the fan mounting hole covers a projection of the fan assembly in the third direction. The fan assembly is slidably installed on the slide rail. When the fan assembly is maintained, the top housing does not need to be disassembled. The fan assembly can be directly pulled out from the top housing, improving maintenance efficiency.

In an implementation, the top housing includes a top rear plate and a detachable top cover plate. The top cover plate and the top rear plate are arranged opposite to each other in the second direction. The condenser and the fan assembly are arranged sequentially between the top cover plate and the top rear plate in the second direction. The top cover plate includes a plurality of air outlets. Each air outlet penetrates through the top cover plate in the second direction. The top cover plate not only can be used as a carrier of the air outlet, but also can facilitate maintenance of the condenser because the top cover is detachably connected. During maintenance, only the top cover plate may be disassembled, and the top housing does not need to be completely disassembled, improving maintenance efficiency of the condenser.

In an implementation, the top housing includes a partition plate. The partition plate is fastened between the condenser and the fan assembly in the second direction. The fan assembly includes a plurality of fans. The partition plate includes a plurality of holes. Each hole penetrates through the partition plate in the second direction. In the third direction, the plurality of fans are arranged sequentially and adjacently and the plurality of holes are arranged sequentially and adjacently. A projection of each fan covers a projection of one hole in the second direction. The foregoing partition plate separates an air inlet side and an air outlet side of the fan assembly. After the fan assembly is turned on, under an action of the partition plate, an area corresponding to the first cavity and an area corresponding to the air inlet side of the fan assembly form negative pressure, and external air (cooling air) is forced to quickly enter the first cavity and the second cavity, so that a flow speed of the cooling air in the heat dissipation channel is increased, and heat in the heat dissipation channel is quickly dissipated.

In an implementation, the rear housing includes a rear bottom plate. The evaporator and the air-cooled heat sink are arranged between the top housing and the rear bottom plate in the first direction. The rear bottom plate includes a plurality of bottom through-holes. Each bottom through-hole penetrates through the rear bottom plate in the first direction. The plurality of bottom through-holes are arranged at an interval sequentially in the third direction. The foregoing bottom through-hole is an air inlet. A heat dissipation channel is formed between the bottom through-hole and an air outlet of a top cover plate. Under an action of the fan assembly, air, based on an attribute of hot air expansion and rising, enters the top-mounted heat dissipation module from below and leaves from above. Cooling air brings out heat in the heat dissipation channel from the air outlet above, thereby improving heat dissipation efficiency.

In an implementation, the rear housing includes a rear back plate. The evaporator and the air-cooled heat sink are arranged sequentially and adjacently between the box and the rear back plate in the second direction. The rear back plate includes two columns of rear through-holes. Each column of the rear through-holes includes a plurality of rear through-holes arranged at an interval. Each rear through-hole penetrates through the rear back plate in the second direction. Projections of the two columns of the rear through-holes do not overlap at least partially with a projection of the air-cooled heat sink in the second direction. The rear through-hole may be used as a supplement air vent. In addition to entering a heat dissipation channel from the foregoing bottom through-hole, cold air outside the device may also enter the heat dissipation channel from the rear through-hole. Cooling air supplemented through the rear through-hole can be mixed with the cooling air introduced by the bottom through-hole. Because a temperature of the supplemented cooling air is low, a temperature of cooling air in the heat dissipation channel is reduced after two streams of cooling air are mixed. A low temperature helps cool the top-installed heat dissipation assembly and the back-mounted heat dissipation assembly, so that heat dissipation capabilities of the top-installed heat dissipation assembly and the back-mounted heat dissipation assembly are effectively improved, further improving heat dissipation efficiency of the top-installed heat dissipation assembly and the back-mounted heat dissipation assembly for the inverter module.

In an implementation, the box includes two box side plates. The two box side plates are arranged opposite to each other in the third direction. At least one of the box side plates includes a maintenance window. The maintenance window penetrates through the box side plate in the third direction. The inverter module includes at least one maintenance cavity. The maintenance cavity is fastened to one box side plate and communicates with the maintenance window of the one box side plate. The maintenance cavity is configured to accommodate an output terminal or an input terminal of the inverter module. The output terminal and an input terminal are configured to electrically connect to an external electric device. An output terminal or an input terminal of the inverter module is electrically connected to the power transistor through the maintenance window. A projection of the maintenance cavity overlaps with a projection of the box and a projection of the rear housing in the third direction. The foregoing maintenance cavity includes a first maintenance cavity and a second maintenance cavity. The first maintenance cavity and the second maintenance cavity are separately provided with a door on a side that faces away from the box. A connection between the external electric device and the photovoltaic inverter device may be completed by opening the door and connecting the external electric device to the output terminal and the input terminal. When the external electric device is connected, the doors of the first maintenance cavity and the second maintenance cavity are kept open. In this way, the connection can be completed without opening the box, and impact on closure of the box and the internal inverter circuit is reduced.

REFERENCE NUMERALS

Figure 1:
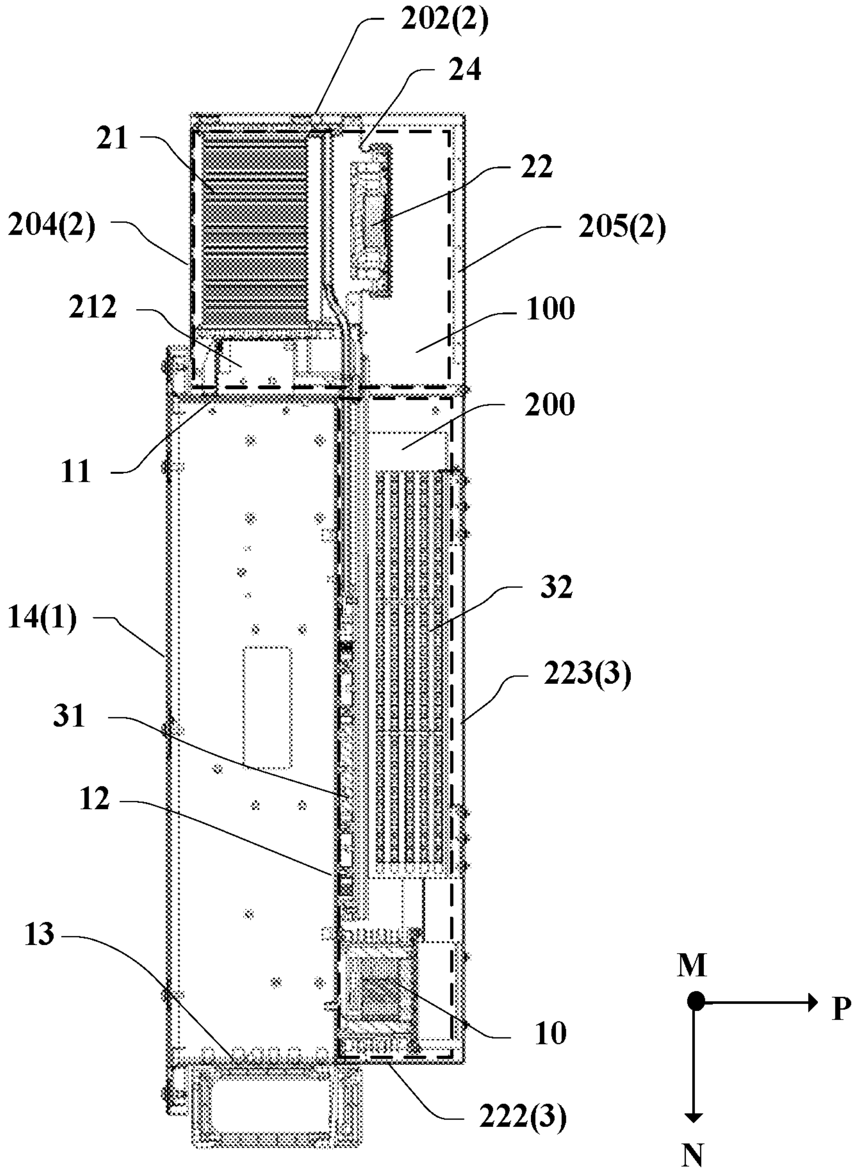
FIG. 1 is a side view of a top-mounted heat dissipation photovoltaic inverter device according to an embodiment of this application.

N: first direction; P: second direction; M: third direction; 1: box; 11: box top plate; 12: box rear plate; 13: box bottom plate; 14: box cover plate; 21: condenser; 22: fan assembly; 31: evaporator; 32: air-cooled heat sink; 121: heat dissipation window; 2: top housing; 3: rear housing; 122: first ventilation hole; 123: second ventilation hole; 341: air supply vent; 342: air return vent; 2131: pipe; 212: bracket; 100: first cavity; 200: second cavity; 201: first top side plate; 202: second top side plate; 203: third top side plate; 204: top cover plate; 205: top rear plate; 2222: second air inlet; 2223: third air inlet; 24: slide rail; 214: fan mounting hole; 222: rear bottom plate; 2221: bottom through-hole; 23: partition plate; 231: hole; 232: flange; 10: inductor module; 124: inductor communication hole; 223: rear back plate; 15: first side plate; 16: second side plate; 17: first maintenance cavity; 18: second maintenance cavity; 151: first maintenance window; 161: second maintenance window.

DESCRIPTION OF EMBODIMENTS

To make objectives, technical solutions, and advantages of this application clearer, the following further describes this application in detail with reference to the accompanying drawings. However, example implementations can be implemented in a plurality of forms, and should not be construed as being limited to the implementations described herein. The same reference numerals in the accompanying drawings represent the same or similar structures, and repeated descriptions will be omitted. Words for expressing locations and directions in embodiments of this application are described by using the accompanying drawings as examples. However, changes may be made as required, and all changes shall fall within the protection scope of this application. The accompanying drawings in embodiments of this application are merely used to show a relative location relationship, and do not represent a real proportion.

It should be noted that specific details are set forth in the following description for ease of fully understanding this application. However, this application can be implemented in a plurality of manners different from those described herein, and a person skilled in the art can perform similar promotion without departing from the connotation of this application. Therefore, this application is not limited to the following disclosed specific implementations.

To facilitate understanding of a top-mounted heat dissipation photovoltaic inverter device provided in this application, an application scenario of the photovoltaic inverter device is first described. A photovoltaic system is a power generation system that uses photovoltaic effect of a semiconductor material to convert solar energy into electric energy. The photovoltaic system may generally include a battery panel and a photovoltaic inverter device, and the battery panel is electrically connected to the photovoltaic inverter device. The battery panel may be configured to convert solar energy into electric energy, and the photovoltaic inverter device is configured to perform power conversion on a current or a voltage from the battery panel, so that output power of the photovoltaic system matches power of an external electric device.

As power and density of a power transistor in the photovoltaic inverter device gradually increase, heat generated by the photovoltaic inverter device becomes increasingly large. An excessively high temperature affects a service life and reliability of the power transistor, and further affects an overall service life of the photovoltaic inverter device. Currently, a conventional heat dissipation manner cannot meet a heat dissipation requirement of a photovoltaic inverter device with high power. Consequently, effective cooling cannot be implemented inside the photovoltaic inverter device, and the service life of the photovoltaic inverter device is affected.

For the foregoing problem, in embodiments of this application, a heat dissipation manner of the photovoltaic inverter device is improved, so that effective heat dissipation for the power transistor can be implemented, thereby reducing a risk of a failure of the power transistor and improving reliability of using the photovoltaic inverter device. The following specifically describes, with reference to the accompanying drawings, a top-mounted heat dissipation photovoltaic inverter device provided in embodiments of this application.

Figure 2:
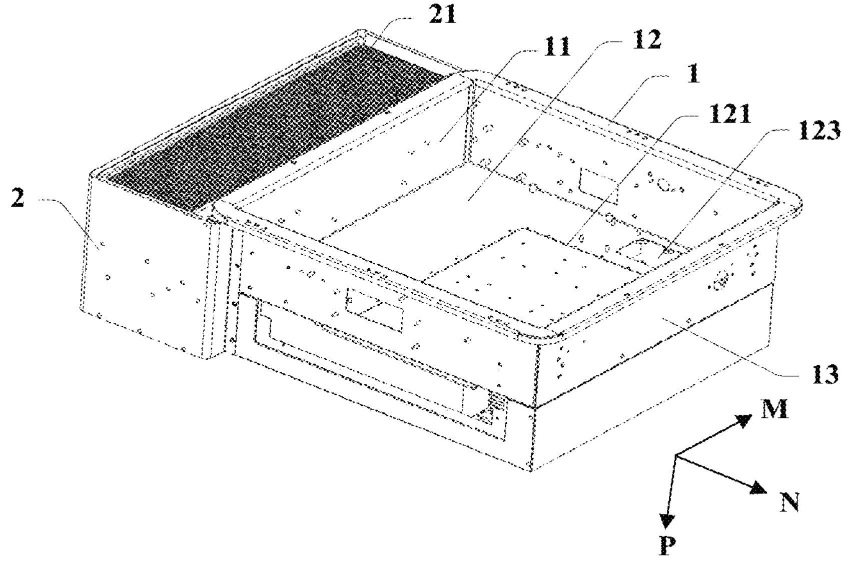
FIG. 2 is an assembly diagram of a box and a top-mounted heat dissipation module according to an embodiment of this application.

FIG. 1 is a side view of a top-mounted heat dissipation photovoltaic inverter device according to an embodiment of this application. FIG. 2 is an assembly diagram of a box and a top-mounted heat dissipation module according to an embodiment of this application. With reference to FIG. 1 and FIG. 2, in an embodiment, the photovoltaic inverter device includes an inverter module and the top-mounted heat dissipation module. The top-mounted heat dissipation module is configured to dissipate heat for the inverter module. The inverter module includes an inverter circuit and a box 1, and the inverter circuit is installed inside the box 1. The inverter circuit (not shown in the figure) includes a power circuit board and a plurality of power transistors, and the plurality of power transistors are installed in the power circuit board. The inverter circuit generates heat when working; and the top-mounted heat dissipation module is installed outside the foregoing box 1, and is configured to dissipate heat for the inverter circuit that generates heat in the box 1, so that the inverter circuit can work normally. The top-mounted heat dissipation module includes a top-installed heat dissipation assembly and a back-mounted heat dissipation assembly. The top-installed heat dissipation assembly includes a condenser 21 and a fan assembly 22, and the back-mounted heat dissipation assembly includes an evaporator 31 and an air-cooled heat sink 32. The condenser 21 and the box 1 are arranged in a laminated manner in a first direction N, the condenser 21 and the fan assembly 22 are arranged adjacently in a second direction P, and the box 1, the evaporator 31, and the air-cooled heat sink 32 are arranged sequentially and adjacently in the second direction P. The evaporator 31 and the condenser 21 are configured to dissipate heat for the inverter circuit, and the air-cooled heat sink 32 is configured to perform heat dissipation for hot air inside the box 1 through heat exchange. The fan assembly 22 is configured to accelerate air circulation around the condenser 21, the evaporator 31, and the air-cooled heat sink 32, to improve heat dissipation efficiency. The foregoing top-mounted heat dissipation module and the inverter module are separately assembled in a pre-integration mode, and then modular vertical assembly is performed on the two modules. An assembly operation is convenient, and working efficiency is improved. The evaporator 31 and the air-cooled heat sink 32 are arranged adjacently, so that space occupied by the back-mounted heat dissipation assembly can be reduced, and a structure of the inverter device is compact. When the foregoing top-installed heat dissipation assembly and the back-mounted heat dissipation assembly are installed, a projection of the top-installed heat dissipation assembly does not overlap with a projection of the back-mounted heat dissipation assembly in a third direction M. In other words, the condenser 21, the fan assembly 22, the evaporator 31, and the air-cooled heat sink 32 do not block each other in the third direction M, so that heat dissipation effect is good, and heat dissipation efficiency of the top-installed heat dissipation assembly and the back-mounted heat dissipation assembly is improved. The foregoing first direction N, the second direction P, and the third direction M are orthogonal to each other.

Still refer to FIG. 1 and FIG. 2. In an embodiment, the foregoing box 1 is a square box, and includes a box top plate 11, a box rear plate 12, a box bottom plate 13, and a box cover plate 14. The box top plate 11 and the box bottom plate 13 are arranged opposite to each other in the first direction N, and the box cover plate 14 and the box rear plate 12 are arranged opposite to each other in the second direction P. The box rear plate 12 includes a heat dissipation window 121, and the heat dissipation window 121 penetrates through the box rear plate 12 in the second direction P. When the foregoing box rear plate 12 is specifically manufactured, a through-hole is provided on the box rear plate 12 as the heat dissipation window 121. During installation, the foregoing power circuit board and the evaporator 31 are fastened to two sides of the box rear plate 12. In the second direction P, a projection of the power circuit board covers a projection of the heat dissipation window 121, and a projection of the evaporator 31 also covers the projection of the heat dissipation window 121. In other words, the power circuit board and the evaporator 31 seal the heat dissipation window 121, so that airtightness of the box 1 is good. The power transistor on the power circuit board is in contact with the evaporator 31 through the heat dissipation window 121, and the evaporator 31 dissipates heat for the power transistor.

Figure 3:
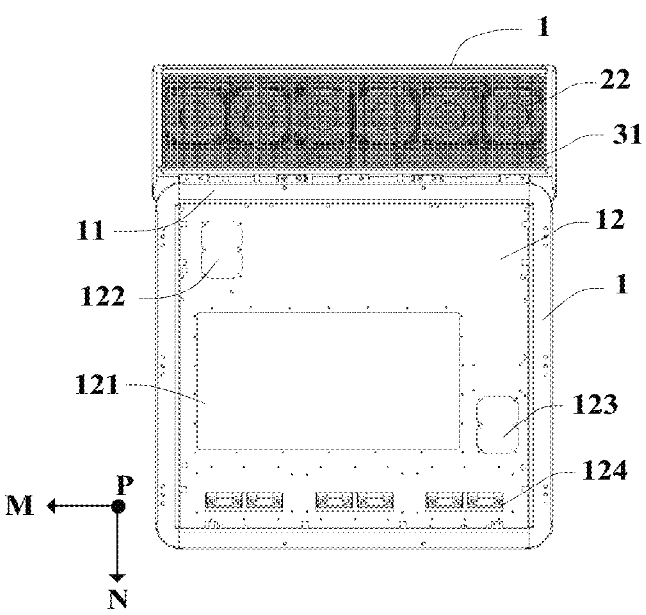
FIG. 3 is a side view of assembly of a top-mounted heat dissipation module and a box according to an embodiment of this application.
Figure 4:
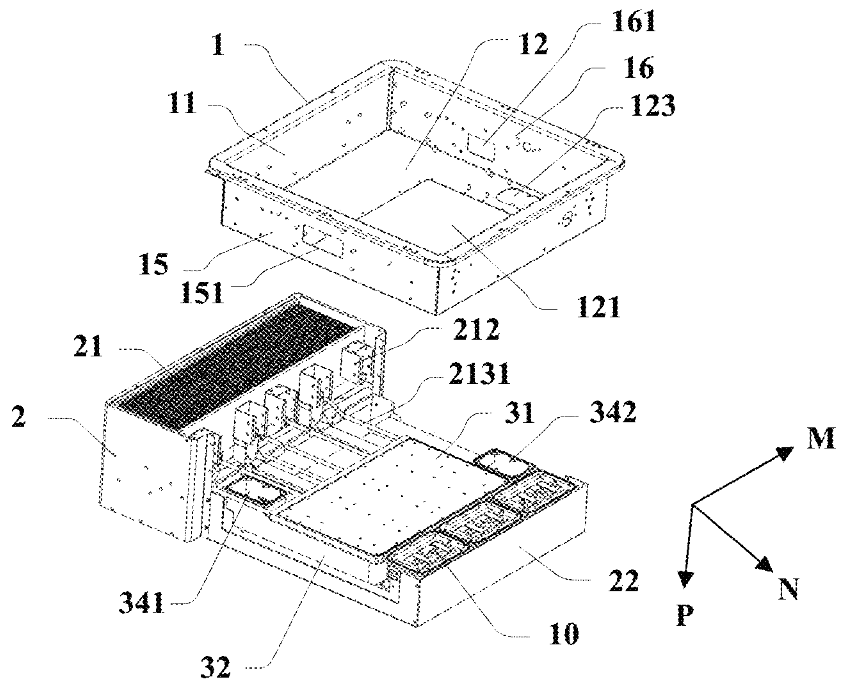
FIG. 4 is an exploded view of a top-mounted heat dissipation module and a box according to an embodiment of this application.

FIG. 3 is a side view of assembly of a top-mounted heat dissipation module and a box according to an embodiment of this application. FIG. 4 is an exploded view of the top-mounted heat dissipation module and the box according to an embodiment of this application. With reference to FIG.

1 to FIG. 4, the foregoing box rear plate 12 further includes two heat exchanger communication holes. The heat exchanger communication holes penetrate through the box rear plate 12 in the second direction P, and the two heat exchanger communication holes are configured to communicate with an inlet and an outlet of the air-cooled heat sink 32 respectively. The foregoing air-cooled heat sink 32 has a heat exchange cavity, and the heat exchange cavity is communicated with the box 1 through the foregoing two heat exchanger communication holes. The foregoing inlet and the outlet of the air-cooled heat sink 32 refer to an air supply vent 341 and an air return vent 342 respectively. In this embodiment, the foregoing two heat exchanger communication holes are a first ventilation hole 122 and a second ventilation hole 123 respectively. The air supply vent 341 communicates with the box 1 through the first ventilation hole 122, and the air return vent 342 communicates with the box 1 through the second ventilation hole 123. Hot air in the box 1 enters the heat exchange cavity of the air-cooled heat sink 32 through the air return vent 342 and the second ventilation hole 123. After heat exchange is performed in the heat exchange cavity, the hot air returns to the box 1 through the air supply vent 341 and the first ventilation hole 122. The air-cooled heat sink 32 cools the hot air in the box 1, so that a low temperature is maintained inside the box 1. This improves working reliability of the inverter circuit. To increase a heat exchange speed between the box 1 and the air-cooled heat sink 32, a fan may be disposed at the first ventilation hole 122 or the second ventilation hole 123, so that a flow speed of air between the box 1 and the heat exchange cavity is increased.

In an embodiment, a distance between the foregoing first ventilation hole 122 and the second ventilation hole 123 is greater than or equal to a preset value. The box rear plate 12 is square, and a first ventilation vent 122 and a second ventilation vent 123 are disposed as far as possible, for example, located on two opposite sides of the box rear plate 12, so that the hot air in the box 1 can be convected and circulated, and an air temperature in the box 1 is uniform, improving heat dissipation efficiency.

In an embodiment, the foregoing first ventilation hole 122 and the second ventilation hole 123 are disposed at locations at two ends of a diagonal line of the box rear plate 12. In this case, a distance between the first ventilation hole 122 and the second ventilation hole 123 is far, so that the hot air in the box 1 can have good convection circulation effect, and an air temperature in the box 1 is uniform, improving heat dissipation efficiency.

Refer to FIG. 4. The foregoing condenser 21 and the evaporator 31 are connected through at least one pipe 2131, and the at least one pipe 2131 is arranged sequentially in the third direction M. The pipe 2131 may include a two-phase pipe. The two-phase pipe includes a gas pipe and a liquid pipe. A liquid refrigerant in the evaporator 31 enters the condenser 21 through the gas pipe after heated, and then a vaporized refrigerant is recondensed into a liquid state through the condenser 21, and flows back to the evaporator 31 through the liquid pipe. In an embodiment, the foregoing first direction N is a gravity direction, and the condenser 21 is higher than the evaporator 31 in the first direction N. In this way, the refrigerant condensed by the condenser 21 into the liquid state flows back to the evaporator 31 under an action of gravity. This helps increase a return flow speed of the refrigerant and improve heat dissipation efficiency. In another embodiment, the foregoing first direction N is a horizontal direction, and a pump body is disposed in the liquid pipe between the condenser 21 and the evaporator 31 to enable the refrigerant to flow back to the evaporator 31.

With reference to FIG. 1 and FIG. 4, the foregoing top-mounted heat dissipation module further includes a plurality of brackets 212, and the plurality of brackets 212 are fastened to the condenser 21. The foregoing plurality of brackets 212 are arranged between the condenser 21 and the box top plate 11 in the third direction M. The box 1 supports the condenser 21 through the plurality of brackets 212, so that the condenser 21 is installed securely, improving reliability of the condenser 21. The foregoing condenser 21 is not in direct contact with the box 1, and heat of the box 1 is not transferred to the condenser 21. The condenser 21 in a low-temperature state so that efficiency of refrigerant condensation of the condenser 21 is improved. In an embodiment, when the foregoing brackets 212 are disposed, two adjacent brackets 212 are spaced at an equal distance, so that the condenser 21 is evenly subjected to a force. In another embodiment, adjacent brackets 212 are spaced at unequal distances, and a proper distance may be selected according to a requirement.

Still refer to FIG. 1. In an embodiment, the foregoing top-mounted heat dissipation module further includes a top housing 2 and a rear housing 3, and the top housing 2 and the rear housing 3 are separately installed on the foregoing box 1. The top housing 2 and the box 1 are arranged in a laminated manner in the first direction N, the box 1 and the rear housing 3 are arranged adjacently in the second direction P, and the top housing 2 and the rear housing 3 are arranged in a laminated manner in the first direction N. A projection of the top housing 2, a projection of the rear housing 3, and a projection of the box 1 do not overlap in the third direction M, to reduce a case in which heat dissipation effect is affected by mutual blocking between housings. The foregoing top housing 2 is configured to fasten the condenser 21 and the fan assembly 22, and the rear housing 3 is configured to fasten the evaporator 31 and the air-cooled heat sink 32. When the top housing 2 and the rear housing 3 are specifically installed, the top housing 2 is set to be detachably connected to the box 1, the rear housing 3 is set to be detachably connected to the box 1, and the top housing 2 is detachably connected to the rear housing 3. In this way, the top-installed heat dissipation assembly and the back-mounted heat dissipation assembly can be conveniently maintained, and a housing at a corresponding location of the condenser 21, the fan assembly 22, the evaporator 31, or the air-cooled heat sink 32 may be disassembled according to a maintenance requirement to perform a maintenance operation.

A gap between the foregoing top housing 2 and the box 1 forms a first cavity 100, and the condenser 21 and the fan assembly 22 are arranged adjacently in the first cavity 100 in the second direction P. A gap between the rear housing 3 and the box 1 forms a second cavity 200, and the evaporator 31 and the air-cooled heat sink 32 are arranged adjacently in the second cavity 200 in the second direction P. The first cavity 100 communicates with the second cavity 200 to form an L-shaped cavity. The cavity is a heat dissipation channel of the top-installed heat dissipation assembly and the back-mounted heat dissipation assembly, and air can flow in the heat dissipation channel, improving heat dissipation efficiency of the top-mounted heat dissipation module.

In an embodiment, in the second direction P, a side on which the box cover plate 14 is located is a front side, and a side on which the box rear plate 12 is located is a rear side. The box cover plate 14 can be opened, to facilitate maintenance of the inverter circuit inside the inverter module. The foregoing top housing 2 is similar to a cover that covers the box top plate 11. The top housing 2 and the box top plate 11 are enclosed to form the first cavity 100. A length of the foregoing first cavity 100 is greater than a length of the box top plate 11 in the second direction P, that is, the top housing 2 extends to the rear side and out of the box top plate 11. The foregoing rear housing 3 is also similar to a cover that covers the box rear plate 12. The box rear plate 12 and the rear housing 3 are enclosed to form the second cavity 200. A length of the second cavity 200 is less than or equal to a length of the box rear plate 12 in the first direction N, that is, a length of the rear housing 3 does not exceed a length of the box rear plate 12 in the first direction N. The top housing 2 is connected to the rear housing 3 to form an L-shaped cover, and the top housing 2 and the rear housing 3 are two sides of the L-shaped cover respectively. The L-shaped cover covers top and rear of the box 1, and the foregoing top-installed heat dissipation assembly and the back-mounted heat dissipation assembly are accommodated in the L-shaped cover. During assembly, the top housing 2 and the rear housing 3 may be first connected, and then the top-installed heat dissipation assembly is installed in the top housing 2, and the back-mounted heat dissipation assembly is installed in the rear housing 3, to complete assembly of the top-mounted heat dissipation module. The inverter circuit is installed in the box 1 to complete assembly of the inverter module. Finally, the top-mounted heat dissipation module and the inverter module are assembled. The foregoing top-mounted heat dissipation module and the inverter module use an integrated modular structure. During production, the top-mounted heat dissipation module and the inverter module are separately pre-assembled, and then assembled as a whole. The top-mounted heat dissipation module and the inverter module may also be separately maintained. The top-mounted heat dissipation photovoltaic inverter device in this application uses a pre-integrated modular assembly manner, so that installation and maintenance work is convenient, improving installation and maintenance efficiency.

Figure 5:
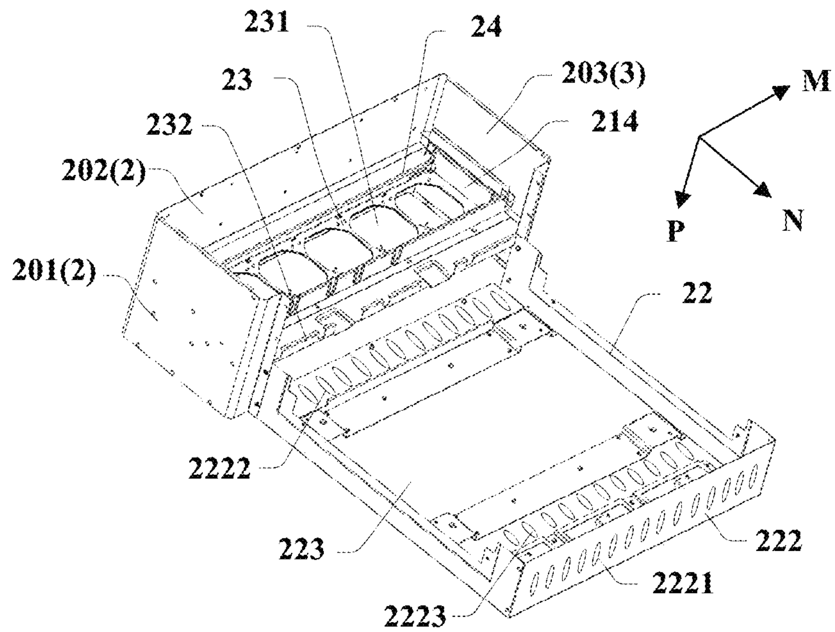
FIG. 5 is a schematic diagram of structures of a top housing and a rear housing according to an embodiment of this application.
Figure 6:
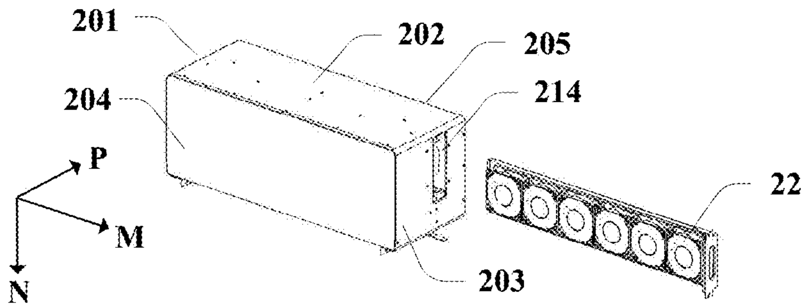
FIG. 6 is an exploded view of a top housing and a fan assembly according to an embodiment of this application.

FIG. 5 is a schematic diagram of structures of a top housing and a rear housing according to an embodiment of this application. FIG. 6 is an exploded view of a top housing and a fan assembly according to an embodiment of this application. As shown in FIG. 5 and FIG. 6, in an embodiment, the foregoing top housing 2 includes two top side plates and a slide rail 24. The two top side plates are arranged opposite to each other in the third direction M. The slide rail 24 is fastened between the foregoing two top side plates. When the foregoing slide rail 24 is specifically installed, the slide rail 24 may be connected to the top housing 2 in a screw connection or rivet connection manner. The slide rail 24 is configured to slidably install the fan assembly 22 in the third direction M. At least one top side plate includes a fan mounting hole 214. A projection of the fan mounting hole covers a projection of the fan assembly in the third direction M. The foregoing top housing 2 includes a first top side plate 201, a second top side plate 202, and a third top side plate 203. The first top side plate 201, the second top side plate 202, and the third top side plate 203 may be formed by bending a strip plate into three segments. The first top side plate 201 and the third top side plate 203 are disposed opposite to each other in the third direction M, and are located on two sides of the second top side plate 202 respectively. The second top side plate 202 is opposite to the box top plate 11. The foregoing two top side plates are the first top side plate 201 and the third top side plate 203. The slide rail 24 is installed between the first top side plate 201 and the third top side plate 203, and two ends of the slide rail 24 extend to the first top side plate 201 and the third top side plate 203 respectively. The foregoing slide rail 24 includes two tracks disposed in parallel, and a distance between the two tracks is consistent with a height of the fan assembly 22, so that the fan assembly 22 can be slidably installed between the two tracks, implementing a detachable connection between the fan assembly 22 and the top housing 2. The fan mounting hole 214 is located on the first top side plate 201 or the third top side plate 203. The projection of the fan mounting hole 214 covers the projection of the fan assembly 22 on the first top side plate 201 or the third top side plate 203 in the third direction M, so that the fan assembly 22 can be inserted into or pulled out of the top housing 2 through the fan mounting hole 214, and is detachably installed on the slide rail 24. When the fan assembly 22 needs to be maintained, the fan assembly 22 can be maintained without disassembling the top housing 2, improving maintenance efficiency.

Still refer to FIG. 6. In an embodiment, the foregoing top housing 2 includes a top rear plate 205 and a detachable top cover plate 204. The top cover plate 204 and the top rear plate 205 are arranged opposite to each other in the second direction P. The condenser 21 and the fan assembly 22 are arranged sequentially between the top cover plate 204 and the top rear plate 205 in the second direction P. The top cover plate 204 includes a plurality of air outlets (not shown in the figure), each air outlet penetrates through the top cover plate 204 in the second direction P, and an air outlet side of the fan assembly 22 faces the air outlet. When the top cover plate 204 is selected, a grid plate may be selected as the top cover plate 204, and a hole of a grid may be used as the air outlet. In another implementation, the foregoing air outlet may also be located on the first top side plate 201, the second top side plate 202, and the third top side plate 203. It should be noted that, when the foregoing air outlet is disposed on the first top side plate 201, the second top side plate 202, or the third top side plate 203, the air outlet should be disposed in an area that is of the top housing 2 and that corresponds to the air outlet side of the fan assembly 22, so that air passing through the fan assembly 22 can flow out of the heat dissipation channel from the air outlet. When the condenser 21 needs to be maintained, the top housing 2 does not need to be completely disassembled, and the condenser 21 can be maintained only by opening the top cover plate 204, improving maintenance efficiency.

With reference to FIG. 1 and FIG. 5, in an embodiment, the rear housing 3 includes a rear bottom plate 222. The evaporator 31 is located between the top housing 2 and the rear bottom plate 222 in the first direction N. The air-cooled heat sink 32 is located between the top housing 2 and the rear bottom plate 222. The evaporator 31 and the air-cooled heat sink are arranged in the second direction P. The rear bottom plate 222 includes a plurality of bottom through-holes 2221. Each bottom through-hole 2221 penetrates through the rear bottom plate 222 in the first direction N. The plurality of bottom through-holes 2221 are arranged at an interval sequentially in the third direction M. The bottom through-hole 2221 is an air inlet, and a heat dissipation channel is formed between the bottom through-hole 2221 and the air outlet of the top cover plate 204. In this embodiment, the first direction N is a gravity direction, and the top housing 2 is located above the rear housing 3 in the first direction N. Under an action of the fan assembly 22, air, based on an attribute of hot air expansion and rising, enters the top-mounted heat dissipation module from below and leaves from above. Cooling air brings out heat in the heat dissipation channel from the air outlet above, thereby improving heat dissipation efficiency.

In an embodiment, the first direction N is the gravity direction, and the foregoing bottom through-hole 2221 faces the ground. The foregoing rear bottom plate 222 is spaced at a specific distance from the ground, so that the cooling air enters the rear housing 3 from the bottom through-hole 2221 and flows upward. The evaporator 31 and the air-cooled heat sink 32 are located above the rear bottom plate 222, and the bottom through-hole 2221 faces the evaporator 31 and the air-cooled heat sink 32. After entering the heat dissipation channel from the bottom through-hole 2221, the cooling air first passes through the evaporator 31 and the air-cooled heat sink 32 to take away heat of the evaporator 31 and the air-cooled heat sink 32, so that a heat dissipation capability of the back-mounted heat dissipation assembly is effectively improved, further improving heat dissipation efficiency of the back-mounted heat dissipation assembly for the inverter module. It should be noted that the foregoing "ground" is an installation surface perpendicular to the gravity direction. The bottom through-hole 2221 faces the installation surface. The foregoing ground is not limited to an actual ground. The photovoltaic inverter device may also be placed on a bearing object such as a bracket that is horizontally disposed. In this case, an upper surface of the bearing object is equivalent to the foregoing "ground".

With reference to FIG. 1 and FIG. 5, in an embodiment, the foregoing top housing 2 includes a partition plate 23. The partition plate 23 is fastened between the condenser 21 and the fan assembly 22 in the second direction P. The fan assembly 22 includes a plurality of fans. The partition plate 23 includes a plurality of holes 231. Each hole 231 penetrates through the partition plate 23 in the second direction P. In the third direction M, the plurality of fans is arranged sequentially and adjacently, and the plurality of holes 231 are also arranged sequentially and adjacently. The quantity of fans is consistent with the quantity of holes 231, and the fans are installed in a one-to-one correspondence. A projection of each fan covers a projection of one hole 231 in the second direction P. When the partition plate 23 is installed, edges of the partition plate 23 are connected to the box top plate 11, the first top side plate 201, the second top side plate 202, and the third top side plate 203 respectively. The fan assembly 22 is in contact with the partition plate 23, and a ventilation vent of the fan communicates with the hole 231. Therefore, the partition plate 23 separates the air inlet side from the air outlet side of the fan. When the fan assembly 22 is installed, one end of the air outlet side of the fan assembly 22 is in contact with the partition plate 23. After the fan assembly 22 is turned on, under an action of the partition plate 23, an area corresponding to the first cavity 100 and an area corresponding to the air inlet side of the fan assembly 22 forms negative pressure, and external air (cooling air) is forced to quickly enter the heat dissipation channel, so that a flow speed of the cooling air is increased, and heat in the heat dissipation channel is quickly dissipated from the air outlet. When the partition plate 23 is manufactured, a diameter of the hole 231 is equal to a diameter of the ventilation vent of the fan. Certainly, in another embodiment, the diameter of the hole 231 may be not equal to the diameter of the ventilation vent of a fan 33. For example, the diameter of the hole 231 is greater than the diameter of the ventilation vent of the fan 33, so that the fan is easily installed in alignment. Alternatively, the diameter of the hole 231 is less than the diameter of the ventilation vent of the fan, to reduce cooling air leakage. The diameter of the hole 231 is processed according to a requirement. This is not specifically limited in this application. The foregoing fan assembly 22 is disposed with the plurality of fans, so that a flow speed of the cooling air in an air duct can be increased, improving heat dissipation efficiency of a top-mounted heat dissipation apparatus.

In another feasible embodiment, a location relationship between the fan assembly 22 and the partition plate 23 is adjusted. The fan assembly 22 is located between the condenser 21 and the partition plate 23 in the second direction P, that is, one end of the air inlet side of the fan assembly 22 is in contact with the partition plate 23. This can also achieve the foregoing technical effect.

The foregoing fan assembly 22 further includes a mounting bracket. The plurality of fans is installed on one mounting bracket to integrate the fan assembly 22, to facilitate maintenance of the fan assembly 22.

In an optional embodiment, the foregoing slide rail 24 may alternatively be fastened on the partition plate 23. After the fan assembly 22 is installed on the slide rail 24, the projection of each fan covers the projection of one hole 231, so that the partition plate 23 can separate an area corresponding to the first cavity 100 and the air outlet side of the fan assembly 22 from an area corresponding to the first cavity 100 and the air inlet side of the fan assembly 22. When the foregoing slide rail 24 is specifically installed, the slide rail 24 may be connected to the partition plate 23 in a screw connection or rivet connection manner.

Still refer to FIG. 5. A thin plate may be selected as the partition plate 23 to reduce a weight of the top-mounted heat dissipation module. Because an edge of the thin plate is thin, a contact area of the partition plate 23 and the box top plate 11 is narrow. Therefore, a flange 232 is disposed at an edge that is of the partition plate 23 and that faces the box top plate 11, so that an attachment area of the partition plate 23 and the box top plate 11 is large. In this way, the partition plate 23 is closely attached to the box top plate 11, and airtightness is good, so that closure of the area corresponding to the first cavity 100 and the air inlet side of the fan assembly 22 and the area corresponding to the first cavity 100 and the air outlet side of the fan assembly 22 is improved, to reduce air volume of the cooling air that flows out of the air outlet side of the fan assembly 22 from the air inlet side of the fan assembly 22 through bottom of the partition plate 23. A bending direction of the flange 232 may face the air inlet side of the foregoing fan assembly 22, or may face the air outlet side. This is not specifically limited in this application. When the flange 232 is specifically processed, a notch may be provided on the flange 232. The notch is configured to avoid the pipe 2131 connecting the condenser 21 and the evaporator 31.

With reference to FIG. 1 and FIG. 3, in an embodiment, the foregoing inverter circuit further includes a plurality of inductor modules 10. The foregoing plurality of inductor modules 10 are arranged sequentially and adjacently in the third direction M. The rear housing 3 is configured to fasten the evaporator 31 and the air-cooled heat sink 32 and is further configured to fasten the plurality of inductor modules 10. The air-cooled heat sink 32 and the inductor modules 10 are arranged in a laminated manner in the first direction N. The foregoing box rear plate 12 includes at least one inductor communication hole 124. The inductor communication hole 124 penetrates through the box rear plate 12 in the second direction P. The inductor communication hole 124 is configured to communicate the power transistor with the inductor module 10. The foregoing inductor module 10 also generates heat when working, and the inductor module is disposed outside the box 1, so that a quantity of heat generation devices in the box 1 is reduced, and density of the heat generation devices in the box 1 is low. This reduces a temperature in the box 1, and further allows a size of the box 1 to be small. The foregoing heat generation devices are the power transistor and the power circuit board. The plurality of inductor modules 10 are located in the second cavity 200, that is, located in the heat dissipation channel. The cooling air entering the heat dissipation channel can cool the evaporator 31 and the air-cooled heat sink 32 and can also cool the inductor module 10. The inductor module 10 is disposed outside the box 1 of the inverter module, and shares the heat dissipation channel with the evaporator 31 and the air-cooled heat sink 32. This not only reduces internal space of the box 1, but also effectively utilizes space of the second cavity 200.

With reference to FIG. 1 and FIG. 5, in an embodiment, the foregoing rear housing 3 includes a rear back plate 223, and the rear back plate 223 is connected to the foregoing top rear plate 205 to form a plane. The evaporator 31 and the air-cooled heat sink 32 are arranged sequentially and adjacently between the box 1 and the rear back plate 223 in the second direction P. The rear back plate 223 includes two columns of rear through-holes. Each column of rear through-holes includes a plurality of rear through-holes arranged at an interval. Each rear through-hole penetrates through the rear back plate 223 in the second direction P. The rear through-hole may be used as a supplement air vent. In addition to entering the heat dissipation channel from the foregoing bottom through-hole 2221, cold air outside the device may also enter the heat dissipation channel from the rear through-hole. The cooling air that enters the heat dissipation channel from the bottom through-hole 2221 passes through the evaporator 31 and the air-cooled heat sink 32, and heat of the evaporator 31 and the air-cooled heat sink 32 increases a temperature of the cooling air. In this case, cooling air with a higher temperature passes through the rear through-hole, and is mixed with new cooling air introduced by the rear through-hole. Because a temperature of the newly introduced cooling air is low, the temperature of the cooling air in the heat dissipation channel decreases after two streams of cooling air are mixed. The foregoing condenser 21 is disposed in the top housing 2. Cooling air of a uniform temperature continues to flow upward, to cool the condenser 21 and take away heat of the condenser 21. The foregoing two columns of rear through-holes reduce a temperature in the heat dissipation channel. A low temperature helps cool the top-installed heat dissipation assembly and the back-mounted heat dissipation assembly, so that heat dissipation capabilities of the top-installed heat dissipation assembly and the back-mounted heat dissipation assembly are effectively improved, further improving heat dissipation efficiency of the top-installed heat dissipation assembly and the back-mounted heat dissipation assembly for the inverter module.

With reference to FIG. 1 and FIG. 5, in a specific embodiment, projections of the two columns of the rear through-holes in the second direction P do not overlap at least partially with a projection of the air-cooled heat sink 32, to reduce areas of the rear through-holes blocked by the air-cooled heat sink 32. In the first direction N, one column of the rear through-holes is a second air inlet 2222, and is located on an upper edge of the air-cooled heat sink 32, and the other column of the rear through-holes is a third air inlet 2223, and is located on a lower edge of the air-cooled heat sink 32. The air-cooled heat sink 32 further includes a fin, and the fin is installed on a side that is of the heat exchange cavity and that faces away from the box 1. Cooling air enters the second cavity 200 from the third air inlet 2223 located upstream of the heat dissipation channel, and flows through the air-cooled heat sink 32 when flowing in the heat dissipation channel, to take away heat of the fin. A temperature of the cooling air rises. In this case, cooling air entering from the second air inlet 2222 located downstream of the heat dissipation channel is mixed with cooling air with a higher temperature again, so that the temperature of the cooling air in the second cavity 200 decreases, so that air in the heat exchange cavity is cooled, helping improve heat dissipation efficiency of the air-cooled heat sink.

Because the heat dissipation channel is long, a temperature of the cooling air gradually increases during flow. The foregoing bottom through-hole 2221, the second air inlet 2222, and the third air inlet 2223 are located at different locations of the heat dissipation channel, so that a large quantity of cooling air of different locations can be introduced into the heat dissipation channel, so that the temperature in the heat dissipation channel is kept in a low state, helping improve heat dissipation efficiency of the top-mounted heat dissipation module.

Figure 7:
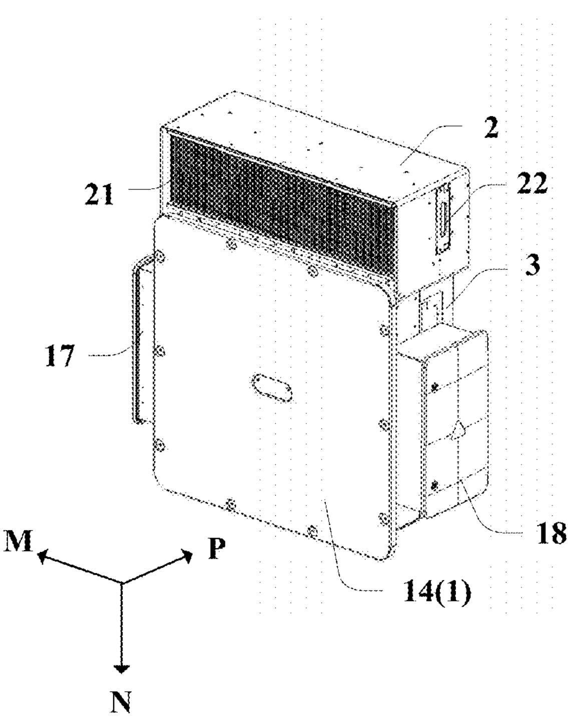
FIG. 7 is a schematic diagram of a structure of a top-mounted heat dissipation photovoltaic inverter device according to an embodiment of this application.

FIG. 7 is a schematic diagram of a structure of a top-mounted heat dissipation photovoltaic inverter device according to an embodiment of this application. With reference to FIG. 4 and FIG. 7, in an embodiment, the foregoing box 1 further includes two box side plates. The two box side plates are arranged opposite to each other in the third direction M. At least one box side plate includes a maintenance window, and the maintenance window penetrates through the box side plate in the third direction M. The inverter module includes at least one maintenance cavity. The maintenance cavity is fastened to one box side plate and is connected to the maintenance window of the one box side plate. The maintenance cavity is configured to accommodate an output terminal or an input terminal of the inverter module. An output terminal or an input terminal of the inverter module is electrically connected to the power transistor through the maintenance window. In this embodiment, the foregoing two box side plates are a first side plate 15 and a second side plate 16. There are two maintenance cavities, namely a first maintenance cavity 17 and a second maintenance cavity 18 respectively. The output terminal (not shown in the figure) is disposed in the first maintenance cavity 17, and the input terminal (not shown in the figure) is disposed in the second maintenance cavity 18. The output terminal and an input terminal are configured to connect to an external electric device. When the first maintenance cavity 17 and the second maintenance cavity 18 are installed, the first maintenance cavity 17 is installed on the first side plate 15, and the second maintenance cavity 18 is installed on the second side plate 16. In the third direction M, a projection of the first maintenance cavity 17 and a projection of the second maintenance cavity 18 overlap with the projection of the box 1, and the projection of the first maintenance cavity 17 and the projection of the second maintenance cavity 18 overlap with the projection of the rear housing 3. A through-hole is provided on the first side plate 15 as a first maintenance window 151, and a through-hole is provided on the second side plate 16 as a second maintenance window 161. The first maintenance cavity 17 and the second maintenance cavity 18 communicate with the box 1 through the first maintenance window 151 and the second maintenance window 161 respectively. The output terminal and the input terminal are electrically connected to the power transistor through the first maintenance window 151 and the second maintenance window 161 respectively. The first maintenance cavity 17 and the second maintenance cavity 18 are separately provided with a door on a side that faces away from the box 1. A connection between the external electric device and the photovoltaic inverter device may be completed by opening the door and connecting the external electric device to the output terminal and the input terminal. When the external electric device is connected, doors of the first maintenance cavity 17 and the second maintenance cavity 18 are kept open. In this way, the connection can be completed without opening the box 1, and impact on closure of the box 1 and the internal inverter circuit is reduced.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application should be subject to the protection scope of the claims.

The invention claimed is:

1. A photovoltaic inverter device comprising:

an inverter comprising:

an inverter circuit comprising a power circuit board and a power transistor, wherein the power circuit board is configured to fasten the power transistor;

a box configured to accommodate the power circuit board; and a top-mounted heat dissipator comprising:

a top-installed heat dissipation assembly comprising a condenser and a fan assembly arranged adjacently in a second direction; and a back-mounted heat dissipation assembly comprising an evaporator and an air-cooled heat sink, wherein the condenser and the box are arranged in a laminated manner in a first direction, wherein the box, the evaporator, and the air-cooled heat sink are arranged sequentially and adjacently in the second direction, wherein an orthographic projection of the top-installed heat dissipation assembly does not overlap with an orthographic projection of the back-mounted heat dissipation assembly in a third direction, and wherein the first direction, the second direction, and the third direction are orthogonal to each other.

2. The photovoltaic inverter device of claim 1, wherein the inverter circuit further comprises a plurality of inductors, wherein the top-mounted heat dissipator further comprises a top housing and a rear housing, wherein the box is configured to fasten the top housing and the rear housing, wherein the top housing and the box are arranged in a laminated manner in the first direction, wherein the rear housing and the box are arranged adjacently in the second direction, wherein the top housing and the rear housing are arranged in a laminated manner in the first direction, wherein the top housing is configured to fasten the condenser and the fan assembly, wherein the rear housing is configured to fasten the evaporator, the air-cooled heat sink, and the plurality of inductors, wherein the plurality of inductors is arranged sequentially and adjacently in the third direction, and wherein an orthographic projection of the top housing, an orthographic projection of the rear housing, and an orthographic projection of the box do not overlap in the third direction.

3. The photovoltaic inverter device of claim 2, further comprising:

a first cavity formed by a first gap between the top housing and the box, wherein the condenser and the fan assembly are arranged adjacently in the first cavity in the second direction;

a second cavity formed by a second gap between the rear housing and the box, wherein the second cavity is configured to accommodate the evaporator, the air-cooled heat sink, and the plurality of inductors, and wherein the evaporator and the air-cooled heat sink are arranged adjacently in the second cavity in the second direction; and at least one pipe arranged in the second cavity in the third direction, wherein the condenser couples with the evaporator through the at least one pipe.

4. The photovoltaic inverter device of claim 3, wherein the box comprises a box top plate and a box bottom plate, wherein the box top plate and the box bottom plate are arranged opposite to each other in the first direction, wherein the box top plate and the top housing are enclosed to form the first cavity, and wherein a length of the first cavity is greater than a length of the box top plate in the second direction.

5. The photovoltaic inverter device of claim 4, wherein the top-mounted heat dissipator comprises a plurality of brackets fastened to the condenser, wherein the plurality of brackets is arranged between the condenser and the box top plate in the third direction, and wherein the box supports the condenser through the plurality of brackets.

6. The photovoltaic inverter device of claim 3, wherein the box comprises a box cover plate and a box rear plate, wherein the box cover plate and the box rear plate are arranged opposite to each other in the second direction, wherein the box rear plate and the rear housing are enclosed to form the second cavity, and wherein a length of the second cavity is less than or equal to a length of the box rear plate in the first direction.

7. The photovoltaic inverter device of claim 6, wherein the air-cooled heat sink comprises a heat sink inlet and a heat sink outlet, wherein the box rear plate comprises two heat exchanger communication holes that penetrate through the box rear plate in the second direction, and wherein the two heat exchanger communication holes are configured to communicate with the heat sink inlet and the heat sink outlet.

8. The photovoltaic inverter device of claim 6, wherein the box rear plate comprises:

a heat dissipation window that penetrates through the box rear plate in the second direction; and a first side facing away from the rear housing, wherein the power circuit board is fastened to the first side, wherein the power circuit board comprises a second side facing the rear housing, wherein the power transistor is fastened to the second side, wherein the power transistor is in contact with the evaporator through the heat dissipation window, and wherein an orthographic projection of the power circuit board and an orthographic projection of the evaporator cover an orthographic projection of the heat dissipation window in the second direction.

9. The photovoltaic inverter device of claim 6, wherein the box rear plate comprises at least one inductor communication hole that penetrates through the box rear plate in the second direction, and wherein the inductor communication hole is configured to couple the power transistor with an inductor of the plurality of inductors.

10. The photovoltaic inverter device of claim 2, wherein the top housing comprises:

two top side plates arranged opposite to each other in the third direction; and a slide rail fastened between the two top side plates, wherein the slide rail is configured to slidably install the fan assembly in the third direction, wherein at least one of the top side plates comprises a fan mounting hole, and wherein an orthographic projection of the fan mounting hole covers an orthographic projection of the fan assembly in the third direction.

11. The photovoltaic inverter device of claim 2, wherein the top housing comprises a top rear plate and a detachable top cover plate, wherein the detachable top cover plate and the top rear plate are arranged opposite to each other in the second direction, wherein the condenser and the fan assembly are arranged sequentially between the detachable top cover plate and the top rear plate in the second direction, wherein the detachable top cover plate comprises a plurality of air outlets, and wherein each of the plurality of air outlets penetrates through the detachable top cover plate in the second direction.

12. The photovoltaic inverter device of claim 2, wherein the top housing comprises a partition plate fastened between the condenser and the fan assembly in the second direction, wherein the partition plate comprises a plurality of holes, wherein each of the plurality of holes penetrates through the partition plate in the second direction, wherein the fan assembly comprises a plurality of fans, wherein, in the third direction, the plurality of fans is arranged sequentially and adjacently and the plurality of holes is arranged sequentially and adjacently, and wherein an orthographic projection of each of the plurality of fans covers an orthographic projection of one of the plurality of holes in the second direction.

13. The photovoltaic inverter device of claim 2, wherein the rear housing comprises a rear back plate, wherein the evaporator and the air-cooled heat sink are arranged sequentially and adjacently between the box and the rear back plate in the second direction, wherein the rear back plate comprises two columns of rear through-holes, wherein each column of the rear through-holes comprises a plurality of rear through-holes arranged at an interval, wherein each rear through-hole penetrates through the rear back plate in the second direction, and wherein orthographic projections of the two columns of the rear through-holes do not at least partially overlap with an orthographic projection of the air-cooled heat sink in the second direction.

14. The photovoltaic inverter device of claim 2, wherein the rear housing comprises a rear bottom plate, wherein the evaporator and the air-cooled heat sink are arranged between the top housing and the rear bottom plate in the first direction, wherein the rear bottom plate comprises a plurality of bottom through-holes, and wherein each of the plurality of bottom through-holes penetrates through the rear bottom plate in the first direction, and wherein the plurality of bottom through-holes is arranged at an interval sequentially in the third direction.

15. The photovoltaic inverter device of claim 2, wherein the box comprises two box side plates arranged opposite to each other in the third direction, wherein at least one of the box side plates comprises a maintenance window that penetrates through the box side plate in the third direction; and wherein the inverter further comprises:

an input terminal;

an output terminal; and at least one maintenance cavity fastened to one box side plate and connected with the maintenance window of the one box side plate, wherein the at least one maintenance cavity is configured to accommodate the output terminal or the input terminal, wherein the output terminal or the input terminal is electrically connected to the power transistor through the maintenance window, and wherein an orthographic projection of the maintenance cavity overlaps with an orthographic projection of the box and an orthographic projection of the rear housing in the third direction.

16. An inverter comprising:

an inverter circuit comprising a power circuit board and a power transistor, wherein the power circuit board is configured to fasten the power transistor;

a box configured to accommodate the power circuit board; and a top-mounted heat dissipator comprising:

a top-installed heat dissipation assembly comprising a condenser and a fan assembly arranged adjacently in a second direction; and a back-mounted heat dissipation assembly comprising an evaporator and an air-cooled heat sink, wherein the condenser and the box are arranged in a laminated manner in a first direction, wherein the box, the evaporator, and the air-cooled heat sink are arranged sequentially and adjacently in the second direction, wherein the top-installed heat dissipation assembly does not overlap with the back-mounted heat dissipation assembly in a third direction, and wherein the first direction, the second direction, and the third direction are orthogonal to each other.

17. The inverter of claim 16, wherein the inverter circuit further comprises a plurality of inductors, wherein the top-mounted heat dissipator further comprises a top housing and a rear housing, wherein the box is configured to fasten the top housing and the rear housing, wherein the top housing and the box are arranged in a laminated manner in the first direction, wherein the rear housing and the box are arranged adjacently in the second direction, wherein the top housing and the rear housing are arranged in a laminated manner in the first direction, wherein the top housing is configured to fasten the condenser and the fan assembly, wherein the rear housing is configured to fasten the evaporator, the air-cooled heat sink, and the plurality of inductors, wherein the plurality of inductors is arranged sequentially and adjacently in the third direction, and wherein the top housing, the rear housing, and the box do not overlap in the third direction.

18. The inverter of claim 17, further comprising:

a first cavity formed by a first gap between the top housing and the box, wherein the condenser and the fan assembly are arranged adjacently in the first cavity in the second direction;

a second cavity formed by a second gap between the rear housing and the box, wherein the second cavity is configured to accommodate the evaporator, the air-cooled heat sink, and the plurality of inductors, and wherein the evaporator and the air-cooled heat sink are arranged adjacently in the second cavity in the second direction; and at least one pipe arranged in the second cavity in the third direction, wherein the condenser couples with the evaporator through the at least one pipe.

19. The inverter of claim 18, wherein the box comprises a box top plate and a box bottom plate, wherein the box top plate and the box bottom plate are arranged opposite to each other in the first direction, wherein the box top plate and the top housing are enclosed to form the first cavity, and wherein a length of the first cavity is greater than a length of the box top plate in the second direction.

20. The inverter of claim 19, wherein the top-mounted heat dissipator comprises a plurality of brackets fastened to the condenser, wherein the plurality of brackets is arranged between the condenser and the box top plate in the third direction, and wherein the box supports the condenser through the plurality of brackets.

* * * * *